Aug. 30, 1966 J. M. GAULT 3,270,258
FIELD EFFECT TRANSISTOR
Filed July 5, 1963

INVENTOR.
JOHN M. GAULT
BY
OSTROLENK, FABER, GERB & SOFFEN
ATTORNEYS

United States Patent Office 3,270,258

Patented August 30, 1966

3,270,258

FIELD EFFECT TRANSISTOR

John M. Gault, Manhattan Beach, Calif., assignor to International Rectifier Corporation, El Segundo, Calif., a corporation of California Filed July 5, 1963, Ser. No. 292,987

8 Claims. (Cl. 317—235)

My invention relates to a field effect transistor, and more specifically relates to a field effect transistor which can be fabricated with simplified techniques as compared to those required of the presently available field effect transistors and can have high power capabilities.

More specifically, with presently available field effect transistors, current control is caused by the broadening of the space charged region around the one or more junctions in the device. The space charge broadening reduces the effective conduction cross-section of the device to thereby limit the current. Such devices are presently formed by diffusing or alloying doping impurities into opposite sides of a semiconductor wafer to thereby create opposing P-N junctions. Since the saturation point of the device is determined by the distance between these junctions, and the resistivity of the material and the distance between the source and the junctions, all of these parameters must be very accurately controlled.

Most critical of these parameters is the junction-to-junction distance. For example, in a silicon device, the junction-to-junction distance must be less than 1 mil if the device is to saturate at reasonably low voltages. To achieve this type of control, both the initial slice thickness of the silicon wafer and the diffusion or alloying depth must be controlled to accuracies of the order of tenths of a mil.

Moreover, the possible errors in slice thickness, diffusion depth, or alloying depth, and the like, may be additive in nature in the standard methods of producing the device.

The present invention relates to a novel field effect transistor structure in which only one of these parameters require accurate control. Moreover, specifically, and in accordance with the invention, a small P type region is centrally located on the surface of an N type area, and a path of current is established through this small P type region from P+ regions on either side of the P region. The current pinching action is then achieved by controlling the space charge in the small P type region.

Accordingly, the manufacture of the device becomes substantially simplified, since there is no critical spacing between opposing junctions which must be met. Moreover, the small length P type region can have any desired breadth so that high current capacity can be achieved.

Accordingly, a primary object of this invention is to provide a novel arrangemnt for field effect transistors which have a more easily controlled geometry.

Another object of this invention is to provide a novel field effect transistor which has a lower source-to-drain resistance than in present field effect transistors.

Another object of this invention is to provide a novel field effect transistor which has a wide range of current or power ratings for the same basic manufacturing process.

Another object of this invention is to provide a novel field effect transistor having good control characteristics with relatively high power capacity.

These and other objects of this invention will become apparent from the following description when taken in connection with the drawings, in which.

Figure 1:
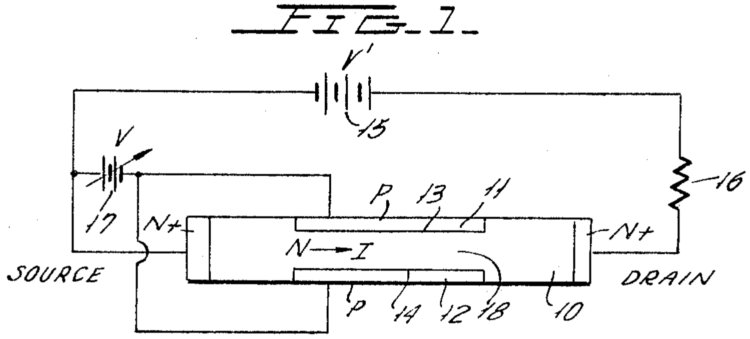
FIGURE 1 illustrates a typical prior art type field effect transistor.

Referring now to FIGURE 1, I have illustrated therein a typical prior art type field effect transistor which is comprised of a body 10 of semiconductor material such as silicon which is of the N type. Two regions 11 and 12 are diffused or alloyed into the body 10 to form the P-N junctions 13 and 14 respectively. The ends of the wafer 10 are then made N+ for reception of electrical terminals.

A source of bias voltage 15 of magnitude V' is then connected across the N+ terminals to an appropriate load 16, while a source of control or grid voltage 17 of variable magnitude V is connected from the left-hand N+ region of wafer 10 to each of the P type regions 13 and 14.

Devices of the type shown in FIGURE 1 are very difficult to fabricate, since the distance between junctions 13 and 14 must be very accurately controlled. For example, the distance between junctions 13 and 14 should preferably be held to less than 1 mil, whereby the initial thickness of wafer 10 and the diffusion or alloying process which forms junctions 13 and 14 must be very accurately controlled.

Even if the device is manufactured with suitable controls, it is still difficult to make such a device to have both good control and large power capacity. That is to say, for the device to have good control, it is necessary that the available conduction area 18 be small and of low resistivity. Moreover, conduction area 18 must not be too long. These conditions are clearly contrary to high power rating requirements.

The principle of the present invention is to provide a novel geometry for a field effect transistor which permits easy fabrication and may be operated with good control characteristics, with low source-to-drain resistances, as compared to the conventional field effect transistor of FIGURE 1.

Figure 2:
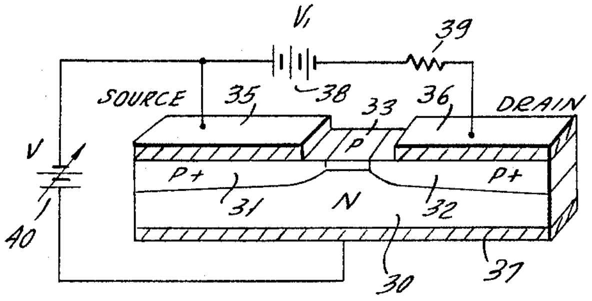
FIGURE 2 illustrates the manner in which a field effect transistor may be manufactured in accordance with the present invention.

Referring now to FIGURE 2, my novel field effect transistor is formed of a base 30 of N type material which has deposited thereon two spaced P+ type regions 31 and 32 with a P type region 33 interposed between regions 31 and 32. Electrodes 35 and 36, which serve as source and drain electrodes respectively, are then secured to P+ regions 31 and 32 respectively, while a further electrode 37 is secured to the base of N type material 30 to serve as the gate or grid electrode.

A biasing voltage source 38 of voltage V' is then connected between electrodes 35, 36 and a load 39, while the source of control voltage 40 of variable voltage V is connected from electrode 35 to the gate or grid electrode 37.

The device of FIGURE 2 may be fabricated according to any of the well known techniques. By way of example, an N type wafer having a thickness, for example, of 15 mils can be prepared and appropriately masked during a boron diffusion cycle, during which regions 31 and 32 are rendered P+. The region 33 specifically is masked during this operation so that there is no P type diffusion in this region. Thereafter, the mask over region 33 may be removed, and a subsequent diffusing cycle may follow during which gallium, for example, is diffused into region 33 to render it of the P type conductivity. Thereafter, electrodes 35, 36 and 37 are applied in any appropriate manner.

During this operation, the length of P type region 33 may be, for example, 5 mils, and will extend to a depth of 1 to 2 mils. The P type diffusion in regions 31 and 32 may reach a non-critical depth of 3 or 4 mils. The breadth of the device depends solely on its power requirements, and could, for example, be from 10 to 100 mils.

During the fabrication process, it will be understood that the distance between the P+ regions 31 and 32 may be made very narrow (as illustrated by the 5 mil distance above) so that the source-to-drain resistance will be made very low compared to a conventional field effect transistor. Note that the increase in the breadth of the P type region 33 has no adverse effect on the operation of the device so that good control which requires saturation at very low voltages is not contradicted by the increase in available area for conduction through the P type region 33.

In operation, current flow is taken through the P type region 33 with the pinching action occuring by the space charge extending from the N type region 30 into the P type region 33.

Thus, for a given grid bias, the space charge region will spread much further into the P region than into the P+ regions. Therefore, the saturation point of the device is not determined to a large extent by the distance between opposing junctions as in the case of FIGURE 1 which required extremely accurate geometry control.

Although this invention has been described with respect to preferred embodiments thereof, it should be understood that many variations and modifications will now be obvious to those skilled in the art, and it is preferred, therefore, that the scope of this invention be limited not by the specific disclosure herein, but only by the appended claims.

The embodiments of the invention in which an exclusive privilege or property is claimed are defined as follows:

1. A field effect transistor comprising a wafer of N type conductivity semiconductor material having a first and second spaced P+ conductivity region extending into one surface thereof, and a P type conductivity region extending into said one surface thereof and being interposed between said first and second P+ regions.

2. The device of claim 1 wherein said first and second P+ regions extend further into said wafer than said P region.

3. The device of claim 1 wherein first and second electrode means are secured to said first and second P+ regions respectively and a third electrode is secured to the other surface of said wafer.

4. The device of claim 1 wherein current flow passes through said P+ regions and said P region under the control of a space charge introduced into said P region from said N material; said P+ regions and said P region being arranged whereby said space charge has greater effect in said P region than in said P+ regions.

5. The device of claim 3 wherein current flow passes through said P+ regions and said P region under the control of a space charge introduced into said P region from said N material; said P+ regions and said P region being arranged whereby said space charge has greater effect in said P region than in said P+ regions.

6. The device of claim 2 wherein first and second electrode means are secured to said first and second P+ regions respectively and a third electrode is secured to the other surface of said wafer.

7. The device substantially as set forth in claim 3 wherein said P type region has a length between said P+ regions of the order of 5 mils and a depth of the order of 2 mils.

8. The device substantially as set forth in claim 7 wherein the breadth of said P region and of said wafer is determined by the power capacity of said transistor.

No references cited.

JOHN W. HUCKERT, *Primary Examiner.*

R. SANDLER, *Assistant Examiner.*